United States Patent
Herbst

(10) Patent No.: US 9,070,873 B2
(45) Date of Patent: Jun. 30, 2015

(54) SYSTEM AND METHOD FOR SENSING TORQUE AND ANGULAR POSITION OF A SHAFT

(75) Inventor: Jan F. Herbst, Grosse Pointe Woods, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 127 days.

(21) Appl. No.: 13/356,942

(22) Filed: Jan. 24, 2012

(65) Prior Publication Data
US 2013/0186209 A1    Jul. 25, 2013

(51) Int. Cl.
| | |
|---|---|
| G01L 3/00 | (2006.01) |
| H01L 41/12 | (2006.01) |
| G01L 5/22 | (2006.01) |
| G01L 3/10 | (2006.01) |

(52) U.S. Cl.
CPC .............. *H01L 41/125* (2013.01); *G01L 5/221* (2013.01); *G01L 3/102* (2013.01)

(58) Field of Classification Search
CPC .......................................................... G01L 3/10
USPC ...................................... 73/862.333
See application file for complete search history.

(56) References Cited

U.S. PATENT DOCUMENTS

| | | | |
|---|---|---|---|
| 5,907,105 A | 5/1999 | Pinkerton et al. | |
| 6,047,605 A * | 4/2000 | Garshelis | 73/862.336 |
| 7,140,258 B2 * | 11/2006 | May | 73/779 |
| 2010/0043570 A1 * | 2/2010 | Grab et al. | 73/862.335 |
| 2012/0137789 A1 * | 6/2012 | Arimura et al. | 73/862.335 |

OTHER PUBLICATIONS

Pinkerton et al., "Processing effects on the magnetostrictive and physical properties of SmFe2/metal composites." J. Appl. Phys. 83:7252-7254, Jun. 1, 1998.

Herbst et al., "Model calculations of torque-induced axial magnetization in circumferentially magnetized rings: Small angle approximation," Journal of Magnetism and Magnetic Materials 176:183-196, 1997.

Herbst et al., "Model calculations of torque-induced axial magnetization in circumferentially magnetized rings: further results," Journal of Magnetism and Magnetic Materials 204: 120-130, 1999.

Pinkerton et al., "Magnetostrictive $SmFe_2$/metal composites," Appl. Phys. Lett. 70: 2601-2603, May 12, 1997.

Pinkerton et al., "Magnetostrictive Sm1xNdxFe2/Fe composites from melt-spun precursors," J. Appl. Phys. 85: 1654-1657, Feb. 1, 1999.

Pinkerton et al., "Magnetostriction and torque response of Tb0.5Dy0.5Fe2/Fe composites," J. Appl. Phys 87: 8653-8657, Jun. 15, 2000.

Herbst et al., "Estimating the effective magnetostriction of a composite: A simple model," App. Phys. Lett. 70: 3041-3043, Jun. 2, 1997.

Pinkerton et al., "$Tb_{1-x}Dy_xFe_2$/Fe composites: compositional effects on torque response," Journal of Magnetism and Magnetic Materials 241: 162-172, 2002.

* cited by examiner

*Primary Examiner* — Lisa Caputo
*Assistant Examiner* — Brandi N Hopkins
(74) *Attorney, Agent, or Firm* — Mark S. Cohen; Pearl Cohen Zedek Latzer Baratz LLP

(57) ABSTRACT

A system and method for sensing torque and angular position of a rotating shaft may include a shaft with a magnetostrictive ring affixed to the shaft. The magnetostrictive ring may generate position-dependent magnetic fields relative to the shaft's rotation. A first sensor may measure a magnetic field that varies with angular position. A second sensor may measure a magnetic field that varies with torque.

15 Claims, 3 Drawing Sheets

SYSTEM AND METHOD FOR SENSING TORQUE AND ANGULAR POSITION OF A SHAFT

FIELD OF THE INVENTION

The present invention relates to a system and method for measuring torque and angular position of a shaft, using for example position-dependent magnetic fields.

BACKGROUND

Torque and position sensing systems are vital for electrical power steering systems in automobiles, among other applications. When a driver steers an automobile, electrical power steering systems may add energy during zero to low speeds when higher torque is required to adequately steer. Power steering systems may also provide feedback force to the driver during high speeds when less torque is required, ensuring that drivers are aware of the forces acting on the front wheel. Detecting the torque and position on the steering column is important to determine how much energy the power steering system should apply to aid the driver in steering.

Prior methods for measuring torque may involve a torsion bar that twists with the amount of force applied to the steering column and a sensor that measures the amount of twisting occurring on the torsion bar. A separate mechanism for measuring angular position may involve a circular resistive tracking circuit with known linear resistance and a positive voltage applied to one end of the track. Voltage may be measured at an output contact moving with the shaft's rotation along the resistive track. The change in voltage may signify the shaft's position. Both of these methods may be expensive to assemble and maintain, and may enlarge the size of the steering column and power steering system.

SUMMARY

A combination system or method for sensing torque and angular position of a rotating shaft may include a shaft with a magnetostrictive ring affixed to the shaft. The magnetostrictive ring may generate magnetic fields varying with the shaft's rotation. A first sensor may measure a magnetic field varying with angular position as the shaft rotates. A second sensor may measure magnetism induced by torque applied to the shaft. A processor may use these measurements to determine angular position of a shaft and torque applied to a shaft.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
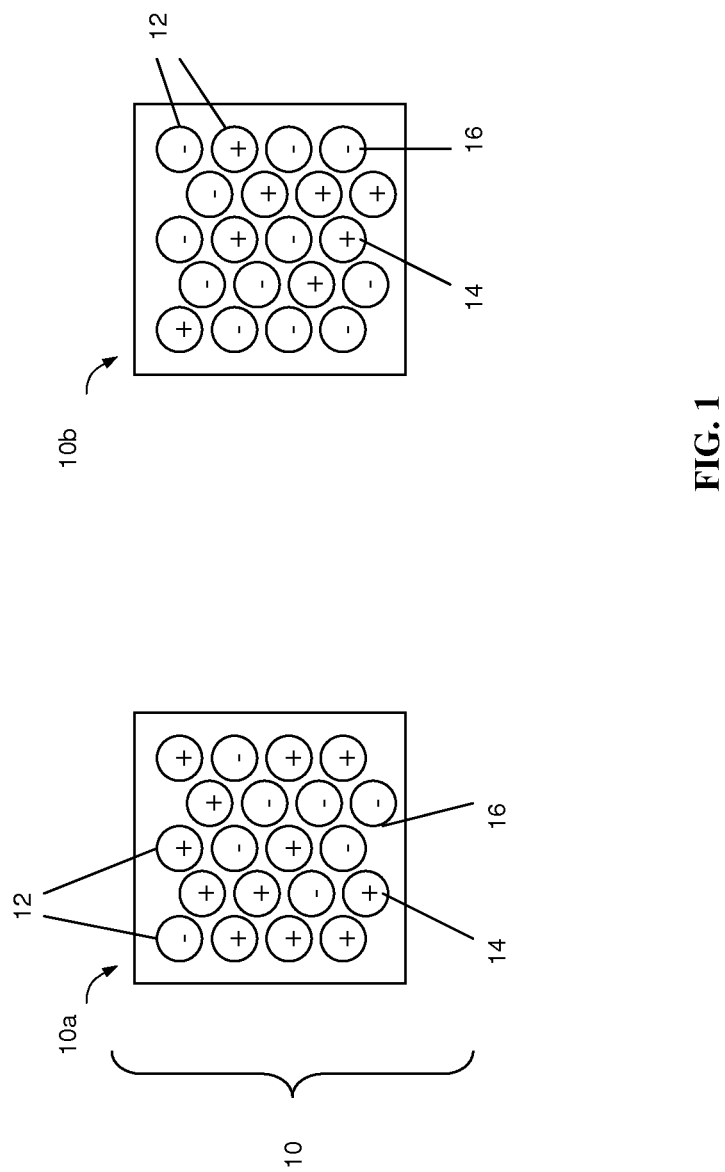
FIG. 1 is a diagram of a magnetic array according to an embodiment of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. It will however be understood by those skilled in the art that the present invention may be practiced without these specific details. In other instances, well-known methods, procedures, and components have not been described in detail so as not to obscure the present invention.

A sensing system according to embodiments of the present invention may include a shaft, a magnetostrictive ring affixed to the shaft, a first sensor for measuring a magnetic field that varies with angular position, and a second sensor for measuring a magnetic field that varies with torque. The rotation of a shaft may be represented by angular position, where a quarter turn of the shaft in a clockwise direction may be represented by, for example, 90 degrees or pi/2 radians. Other suitable ways of representing the shaft's rotation may be used. A first sensor may measure a magnetic field that varies with angular position when the first sensor registers a changing strength and direction in the magnetic field as the magnetostrictive ring rotates in the vicinity of the first sensor. When the shaft rotates, the shaft and magnetostrictive ring may experience torque, and the magnetostrictive ring's magnetic field may vary in strength and/or direction with the amount of torque. A method may involve rotating a shaft with a magnetostrictive ring affixed to the shaft, measuring a magnetic field that varies with the shaft's angular position and measuring magnetic field changes induced by torque applied to the shaft or ring. A magnetic field that varies with angular position may be generated by a magnetostrictive ring that includes magnetically differentiated areas arranged circumferentially around the magnetostrictive ring. Areas may be magnetically differentiated from the surface of the magnetostrictive ring if the magnetic field emitted by the areas have different strength and/or direction than the magnetic field emitted by the surface of the magnetostrictive ring. For example, if the surface of the magnetostrictive ring is magnetized in a circumferential direction, the areas may have magnetic differentiation if they are magnetized in a radial direction, or in a direction normal to the surface of the magnetostrictive ring. Other configurations may be used.

The areas may be magnetically differentiated through positive magnetization, negative magnetization, demagnetization, or any combination thereof, depending on whether the magnetostrictive ring is or is not initially magnetized, or other factors. If the magnetostrictive ring is initially magnetized, the areas may be of a different magnetization than the magnetostrictive ring, or unmagnetized. If the magnetostrictive ring is unmagnetized, the areas may be magnetized. The magnetically differentiated areas may be placed at, for example, regular angular increments around the magnetostrictive ring and may amount to a radial code that signifies the angular position of the shaft as each area comes within close vicinity of a first sensor. The magnetically differentiated areas may be magnetized to emit a magnetic field with a radial direction, or a direction that is normal to the surface of the magnetostrictive ring. When the shaft rotates in the vicinity of a sensor, the magnetically differentiated areas may vary their distance with the first sensor, creating a magnetic field that varies with the shaft's angular position and is measured by the first sensor. The magnetically differentiated areas together may generate a radial magnetic field (e.g., a magnetic field having a radial direction) that varies in strength with angular position of the shaft. A processor or circuit connected to the first sensor may determine the angular position of the shaft based on these measurements. The magnetism of the magnetostrictive ring itself (e.g., a magnetism separate from specific magnetized areas used to measure position) may change in proportion to the torque applied to the shaft. The relationship between the torque applied to the shaft and the change in magnetic field that it induces may depend on the initial magnetization of the magnetostrictive ring and its chemical composition. A second sensor may measure the magnetic field that varies in strength and/or direction with torque applied to the shaft. A processor connected to the second sensor may determine the torque applied to the shaft, based on these measurements.

Magnetism and magnetic field may be interchangeable terms that describe the magnetic moment, or force, that an object or region exerts on another object or region. While magnetism may particularly describe the way that an object's subatomic particles are aligned, any object's magnetism may also describe the magnetic field emitted by the object. A magnetic field may be described by a vector field describing magnetic moment, and may include a direction and a magnitude (e.g., an intensity or strength). Magnetic field vectors or field lines may be emitted from a magnetic pole (e.g., magnetic dipoles, monopoles). Regions of a material or object may be or may include magnetic dipoles. Magnetic dipoles may, for example, be positively and/or negatively magnetized regions (e.g., emitting magnetic fields) of varying magnitude.

Magnetic fields may, for example, be generated using electromagnets, permanent magnets, ferromagnetic metals, spatially modulated magnetic field based devices, or other components or devices. A magnetic field may be spatially modulated, in that multiple adjacent magnetic fields (positive or negative) from an arrangement or array of magnetic sources create a close field of different magnetic polarizations and intensities. Spatially modulated magnetic fields may, for example, be created from an array of magnetic or electric field emission sources or magnetized regions in a material (e.g., a ferromagnetic metal). A magnet may, for example, be material or an object that emits or produces a magnetic field, which may be a vector field including a direction and a magnitude (e.g., an intensity or strength). A material (e.g., a ferromagnetic material, metal, or other type of material), object, or regions of a material or object may, for example, be positively, negatively, or neutrally magnetized. Spatially modulated magnet fields may, for example, include a unique arrangement, combination or array of positively and negatively magnetized regions in a material. Such an array may be arranged horizontally on a flat object, flat portion of an object, a surface or other portion (such as a curved surface or an interior portion) of an object, or a plane. Each of multiple magnetized regions (e.g., magnetic regions, maxels, or other regions) may, for example, be a positively or negatively polarized magnetic field emission source of a pre-determined intensity. A magnetic region may be a region of varying size, surface area (e.g., 1 micron (μm) or greater in diameter), or volume. Multiple positive or negative magnetically charged regions may be arranged in an array or pattern on or in a material. An array or pattern of magnetized regions may, for example, create a unique magnetic pattern, fingerprint or signature. The array of magnetized regions may, for example, be pre-selected, programmed, or determined to have desirable properties (e.g., with other materials or objects with an array of magnetic regions or other magnetic materials).

Magnetostrictive materials may, for example, be ferromagnetic materials that change magnetism when an external force, such as torque, strains the material and slightly changes its initial shape. Ferromagnetic materials may include separate magnetic domains of uniform magnetic polarization. The magnetic domains of a ferromagnatice material together may contribute to the material's magnetic behavior. When ferromagnetic materials are exposed to an external magnetic field, for example, their magnetic domains may align themselves with the polarity of the external magnetic field, allowing the ferromagnetic material to be magnetized and generate a stronger magnetic field. Ferromagnetic materials may be demagnetized when their magnetic domains each have randomized polarity, and the material may then generate a weaker magnetic field. The demagnetization process may involve, for example, heating the ferromagnetic material to its Curie temperature, which randomizes the magnetic polarity of the material's atoms. Ferromagnetic materials may be naturally magnetized or unmagnetized without these methods. When magnetostrictive materials are strained by an external force such as torque, their magnetic domains may rotate or shift, such that the domains may change polarity for example. The change in the domains' polarity causes the material to have a different magnetism than when an external force is not acting on it.

Magnetostrictive materials may be composed of iron, nickel, cobalt, rare earth metals, or their alloys, for example. The change in magnetism from an external force may result in a changed magnetic field (e.g., direction and magnitude of the vector field representing magnetic field may change) surrounding the magnetostrictive material. A magnetostrictive material may, for example, be initially unmagnetized and become magnetized when an external influence like torque is applied to it. A magnetostrictive material may also be initially magnetized, naturally or through methods such as exposing the material to an external magnetic field. The magnetostrictive material may change magnetism and generate a different magnetic field when an external influence, such as torque, is applied. The change in magnetic field, e.g., in magnitude and direction for example, may be proportionate to the amount of torque applied to the material, and thus torque applied on a magnetostrictive ring may be calculated or estimated based on the magnetic field measurements of the magnetostrictive ring.

In some embodiments, a magnetostrictive ring, band, hoop, or annular piece may be affixed to a shaft, so that, for example, the ring will rotate in conjunction with the rotation of the shaft. A shaft may be any cylindrical element having an axial direction along its length and a circumferential direction around the cylinder wall and normal to the axial direction. When the shaft rotates in a circumferential direction, the affixed magnetostrictive ring may rotate in the same circumferential direction and have the same angular position as the shaft. The magnetostrictive ring may also have a cylindrical shape having an axial direction along its length and a circumferential direction around the cylinder wall and normal to the axial direction. In one embodiment, the magnetostrictive ring may be manufactured as a separate component from the shaft, and may be affixed in a separate manufacturing step. The magnetostrictive ring may have a same or different radius as the shaft.

In some embodiments, the magnetostrictive ring, band, hoop, or annular piece may include differentially magnetized areas arranged along a circumferential direction. For example, differentially magnetized areas may be placed around the circumference of the ring in intervals of 30 degrees or 45 degrees (e.g., pi/6 or pi/4 radians); other intervals may be used. If a magnetostrictive ring is initially unmagnetized, the areas may be magnetized through laser magnetization methods or localized heating methods, for example, and each area may generate a magnetic field with high near-field density. If a magnetostrictive ring is initially magnetized, the areas may be unmagnetized through laser demagnetization methods or localized heating methods. The areas may also be magnetized but may generate a magnetic field that has a different magnitude and direction than the ring's initial magnetization. Areas on the ring may have differentiated magnetization through laser magnetization methods or localized heating methods, for example; other methods of creating differentiated magnetization may be used.

In some embodiments, each of the differentially magnetized areas may include a magnetic array with multiple adjacent magnetic regions (e.g. maxels) that may generate spatially modulated magnetic fields. A magnetic array may, for example, generate higher near-field magnetic flux than a typical magnet due to the fact that positively magnetized regions (e.g., positive poles) are located next to or in close proximity to negatively magnetized regions (e.g., negative poles). The close proximity of positively charged regions and negative charged regions may result in reduced far-field magnetic flux and increase near-field magnetic flux because a shortest path or path of least resistance between oppositely polarized magnetized poles may be reduced. As a result of greater near-field magnetic flux, magnetic force (e.g., attractive or repulsive magnetic force) between one magnetic array and another ferromagnetic object, or between two complementary magnetic arrays, may be concentrated in the near-field and drop dramatically with distance. A magnetic array passing in the vicinity of a sensor, such as a Hall effect sensor, may register a magnetic moment that peaks dramatically within a narrow range of position. Other magnetic sensors, such as scalar magnetometers, may detect this magnetic field characteristic in magnetic arrays.

The magnetic array may be composed of any suitable configuration, arrangement, or grouping of positively and negatively magnetized regions. The magnetic array may, for example, include adjacent positively magnetized regions and adjacent negatively magnetized regions. The magnetic array may be configured in a way that generates a higher near-field magnetic flux, or, in another example, directs the magnetic field towards a ferromagnetic object. An array or pattern of magnetized regions may, for example, create a unique or relatively unique magnetic pattern, fingerprint or signature. The array of magnetized regions may, for example, be preselected, programmed, or determined to have desirable properties (e.g., with other materials or objects with an array of magnetic regions or other magnetic materials).

In a preferred embodiment, the differentially magnetized areas may include magnetic arrays, arranged along the circumference of a magnetostrictive ring. Each area may include a magnetic array with a unique or relatively unique magnetic pattern, such that each area may generate a unique or relatively unique spatially modulated magnetic field, e.g. a code or a radial code. Since each area around the circumference may have a different magnetic pattern or code that corresponds to a certain position of rotation or position of the shaft, a processor or circuit connected to a sensor may be able to determine angular position based on which area is in the sensor's vicinity. The processor may reference a lookup table or memory and match the area's magnetic pattern to its radial position.

FIG. 1 is a diagram of a magnetic array according to embodiments of the present invention. Referring to FIG. 1, in some embodiments, a magnetic array 10 made of magnetic materials or components may generate a spatially modulated magnetic field. Spatially modulated magnetic field may, for example, be generated by an array 10 of magnetic or electric field emission sources or magnetized regions 12 in a material (e.g., a ferromagnetic metal, or a ring). A magnetic array 10 may, for example, include an arrangement and/or combination of magnetized regions 12 (e.g., maxels, magnetic dipole regions, or other regions). Magnetized regions 12 may include positively magnetized regions 14, negatively magnetized regions 16, or other types of magnetized regions. Each of multiple magnetized regions 12 may, for example, be a positively polarized magnetic field emission source 14 or negatively polarized magnetic field emission source 16 of pre-determined magnitude (e.g., magnitude, strength, or intensity of magnetic field). A magnetic region 12 may be a region of any suitable size, surface area (e.g., 1 micron (μm) or greater in diameter, or other dimensions), shape, or volume. Multiple positively magnetized regions 14 and negative magnetized regions 16 may be arranged in an array or pattern on a material (e.g., generating a spatially modulated magnetic field). Positively magnetized regions 14 and negative magnetized regions 16 may, for example, be arranged in a grid, staggered grid, predetermined pattern (e.g., a spiral or other pattern), random pattern, or any other spatial arrangement. A magnetic array 10 may, for example, generate a unique magnetic field (e.g., a magnetic finger print or signature).

Spatially modulated magnetic fields generated by magnetic arrays 10 on two or more materials or objects may be defined or pre-determined such that the two magnetic fields and thus the materials may complement one another. Spatially modulated magnetic fields generated by magnetic arrays 10 on two or more materials may, for example, complement one another by generating an attractive, repulsive, or neutral magnetic force between the two materials. The strength or magnitude of the magnetic force between two magnetic arrays 10 may be a function of a distance between two materials and/or other parameters. The strength or magnitude of the magnetic force between a magnetic array 10 generating a spatially modulated magnetic field and another ferromagnetic material may be a function of a distance between the two materials and/or other parameters.

Magnetic arrays 10 may, for example, be predefined such that two objects are attracted so that the magnetic force moves the two objects to a predefined orientation relative to each other. Two materials (e.g., a first material and a second material) may be magnetically attracted in a predefined orientation if magnetic arrays 10 on each of the materials (e.g., magnetic array 10a on a first material and magnetic array 10b on a second material) are attracted when properly aligned. Magnetic arrays of two materials (e.g., magnetic array 10a and magnetic array 10b) may be attracted if positively magnetized regions 14 on first magnetic array 10a, when arranged in the pattern of array 10a, align with negatively charged regions 16 on second magnetic array 10b, when arranged in the pattern of array 10b, and negatively magnetized regions 16 on first magnetic array 10a, when arranged in the pattern of array 10a, align with positively charged regions 14 in second magnetic array 10b, when arranged in the pattern of array 10b. In some embodiments, attraction between array 10a and array 10b may be maximized when array 10a and array 10b are oriented so that corresponding complementary maxels on each are oriented opposite one another within the respective pattern on each array (e.g., the arrays line up or match). The magnitude of attractive force between magnetic arrays 10 of two materials (e.g., a first magnetic array 10a and a second magnetic array 10b) may, for example, be related to or be a function of a distance between two materials and/or other parameters. A magnetic attraction force may, for example, occur if two magnetic arrays 10 are within a threshold distance of one another. Two magnetic arrays 10 may, for example, be magnetically neutral or magnetically repulsive beyond or outside of a threshold distance. Similarly, a magnetic repulsive or repelling force may, in some embodiments, occur if two magnetic arrays 10 (e.g., a first magnetic array 10a and a second magnetic array 10b) are within a threshold distance of one another.

Figure 2A:
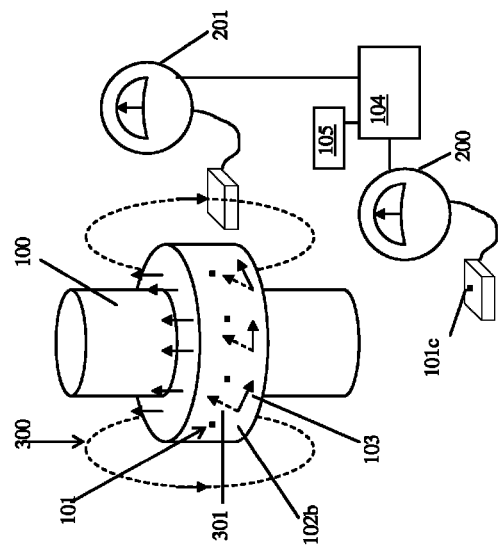
FIGS. 2A and 2B are schematic diagrams of systems measuring torque and angular position of a shaft, according to embodiments of the present invention.
Figure 2B:
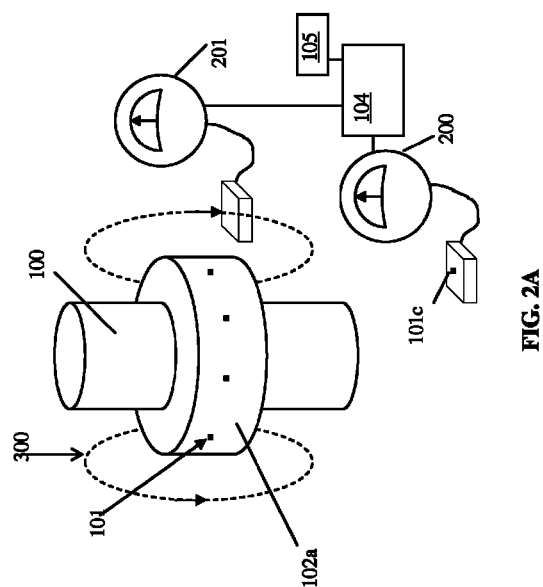

FIGS. 2A and 2B are two configurations of a sensing system to determine angular position of a shaft and torque applied to the shaft, according to embodiments of the present invention. Referring to FIG. 2A, in one embodiment, a magnetostrictive ring, band, or annular piece 102a is affixed to or part of a shaft 100 and may be initially unmagnetized except for certain areas 101 of differentiated magnetism. Unmagnetized magnetostrictive ring 102a including magnetized areas 101 may generate a magnetic field varying with the ring 102a or shaft's 100 angular position by arranging the areas 101 around the ring's 102a circumference. As the shaft 100 rotates, the magnetostrictive ring 102a may rotate in conjunction with the shaft 100. The magnetostrictive ring 102a may have the same angular position as the shaft 100, and have the same torque applied to it. A first sensor 200 may measure the magnetic field varying with angular position of the shaft 100, and output measurements to a processor or control device 104, which may for example read instructions from a memory 105. The magnetostrictive ring 102a, though initially unmagnetized, may become magnetized when it experiences an external force such as torque, and the magnetic field 300 around the magnetostrictive ring 102a may change in response to an applied torque. A second sensor 201 may measure changes in the magnetic field induced by the shaft's 100 rotational torque, and output measurements to a processor or control device 104, which may for example read instructions from a memory 105. Since the magnetostrictive ring 102a may be unmagnetized except for certain areas 101, the areas 101 may be positively or negatively magnetized. An area 101 may have differentiated magnetization through laser magnetization methods or localized heating methods, for example. Other methods of creating magnetized areas may be used.

In one embodiment, an area 101 may, for example, include a magnetic array 10 of multiple adjacent magnetic regions 12 (or maxels), and may generate spatially modulated magnetic fields. Each area 101 may be placed around the circumference of the ring 102a in regular intervals of 30 degrees or 45 degrees (e.g., pi/6 or pi/4 radians); other intervals may be used. An area 101 having a magnetic array 10 may, for example, generate higher near-field magnetic flux than a typical magnet due to the fact that positively magnetized regions 14 (e.g., positive poles) are located next to or in close proximity to negatively magnetized regions 16 (e.g., negative poles). First sensor 200 in the vicinity of an area 101 having a magnetic array 10 may register, for example, a peak magnetic force within a narrow range of position, and magnetic force that drops with greater magnitude than typical magnets over distance. First sensor 200 may, for example, be a Hall effect sensor, a vector magnetometer, a scalar magnetometer, or other similar devices. First sensor 200 may include a complement 101c of the magnetic array 10 included in an area 101 (e.g., the sensor may include magnetic array 10b if the area includes magnetic array 10a, or vice versa) to register an even greater near-field magnetic force. The complement 101c having array 10b in first sensor 200 may be arranged or oriented such that areas 101 having array 10a are oriented opposite one another (e.g., the arrays line up or match such that positive magnetic regions in one array align with negative regions in the other) within the respective pattern on each array when array 10a rotates past array 10b. In other embodiments, complements need not be used. If a number of magnetic arrays, each having a different magnetic pattern, are used in different areas 101, a number of different complements 101c, each matching one or more magnetic patterns on an area 101, may be used on the sensor. Matching a specific area 101, using its magnetic pattern, to a specific complement 101c, may allow for a specific rotational position for the shaft to be determined.

In other embodiments, each area 101, arranged circumferentially by specified angular intervals, may include a magnetic array 10. Each magnetic array 10 may include a unique or relatively unique combination or arrangement of multiple adjacent positively magnetized regions 14 and negatively magnetized regions 16 such as a magnetic pattern, fingerprint or signature. Each magnetic array 10 may generate a unique spatially modulated magnetic field that indicates a specific rotational position. First sensor 200 may be able to measure and distinguish among each unique spatially modulated magnetic field as areas 101 rotate past it, and output results to a processor that may determine position based on the unique spatially modulated magnetic field. Each magnetic array 10 or area 101 may, in other embodiments, not have a unique pattern, and in other embodiments magnetic areas other than a magnetic array may be used.

In another embodiment, areas 101 may be positively or negatively magnetized without including magnetic arrays. Because magnetic fields may vary with distance, first sensor 200 may measure a magnetic field varying with angular position of the shaft 100, when each area 101 varies its distance with the first sensor 200 during the shaft's 100 rotation.

First sensor 200 may output measurements of a magnetic field to a processor 104, which may determine the angular position of the shaft based on the sensor's 200 measurements. Processor 104 may be, for example, a central processing unit (CPU), a chip, or any suitable computing or computational device. Processor 104 or controller may include multiple processors, and may include general-purpose processors and/or dedicated processors such as graphics processing chips. Processor or controller 104 may execute code or instructions, for example, stored in a memory 105 or another device. Processor 104, may determine the shaft's 100 angular position by, for example, counting the number of areas 101 that pass within the vicinity of the sensor 200, or correlating the strength of the magnetic field with angular position, among other methods. If, for example, each area is uniquely coded with a different pattern and corresponds to a specific angular position, processor 104 may determine the shaft's 100 angular position by comparing first sensor's 200 output to a table or memory 105. In another example, if each area 101 is magnetized in the same way or with the same pattern, processor or controller 104 may be able to keep track of the number of areas 101 that pass within a sensor's 200 vicinity and also consider the direction of the shaft's 100 rotation. In this way, processor may be able to calculate the amount of the shaft's 100 rotation, e.g., how many increments of pi/6 or another rotational distance that the shaft 100 has rotated in the clockwise direction.

Referring to FIG. 2A, according to an embodiment of the present invention, the magnetostrictive ring 102a may be initially unmagnetized and may become magnetized when an external force, such as torque, is applied. Since magnetostrictive ring 102a is affixed to the shaft 100, any torque applied to the shaft 100 may also apply to the magnetostrictive ring 102a. Magnetostrictive ring 102a may generate an external magnetic field 300 when the shaft 100 rotates. Second sensor 201 may measure external magnetic field 300 and output measurements to a processor 104. Processor 104 may determine torque applied to the shaft 100, since the external magnetic field 300 direction and/or magnitude may be proportional to the amount of torque applied.

Referring to FIG. 2B, in an embodiment of the present invention, a magnetostrictive ring 102b affixed to a shaft 100 may be initially magnetized in a circumferential direction 103, for example. The magnetostrictive ring 102b may include magnetically differentiated areas 101 arranged around the circumference of the ring 102b. As shaft 100 rotates, magnetostrictive ring 102b may rotate in conjunction with the shaft 100. Magnetostrictive ring 102b may have the same angular position as the shaft 100, and have the same torque applied to it. On a circumferentially magnetized 103 magnetostrictive ring 102b, magnetically differentiated areas 101 may emit a magnetic field with different magnitude and direction (e.g. in a radial direction) than the magnetic field emitted from the surface of magnetostrictive ring 102b. A first sensor 200 may measure a magnetic field varying with angular position, and output measurements to a processor or control device 104, which may read instructions from a memory 105. The magnetism of the magnetostrictive ring 102b may change in magnitude and direction when an external force such as torque is applied to the ring 102b. A second sensor 201 may measure a magnetic field varying with torque applied to ring 102b or shaft 100, and output measurements to a processor or control device 104, which may read instructions from a memory 105.

In one embodiment, the areas 101 may include magnetic arrays 10 of multiple adjacent magnetic regions 12, and they may emit spatially modulated magnetic fields. In another embodiment, areas 101 may be positively, negatively, or neutrally magnetized without including magnetic arrays. Because magnetic fields may vary with distance, first sensor 200 may measure a magnetic field varying with angular position when each area 101 varies their distance with the first sensor 200 during the shaft's 100 rotation. Regardless of the way that areas 101 are magnetized, they may have a magnitude or direction that is distinct from the magnetic field emitted by the surface of the magnetostrictive ring 102b. For example, on circumferentially magnetized 103 magnetostrictive ring 102b, areas 101 may be magnetized in a radial direction, or a direction normal to the surface of the magnetostrictive ring 102b and that points towards first sensor 200 when the area 101 passes its vicinity. As the magnetostrictive ring 102b rotates, the areas 101 collectively may create a radial magnetic field with a strength that varies with the shaft's 100 angular position. This magnetic differentiation may improve the first sensor's 200 ability to distinguish between areas 101 and measure a magnetic field that varies with the shaft's 100 angular position.

When the circumferentially magnetized 103 magnetostrictive ring 102b rotates with the shaft 100, torque acting on the magnetostrictive ring 102b may change the magnetic field of the magnetostrictive ring 102b towards a more axial direction 301. An axial direction 301 may be a direction that is parallel to the length of the shaft 100. This may generate an external magnetic field 300 with magnitude and direction that is proportional to the torque applied. Second sensor 201 may output measurements of the axial magnetic field 300 to the processor 104. In other embodiments, the magnetostrictive ring 102b may also be initially magnetized in another direction, such as diagonally on the cylindrical wall surface.

Figure 3:
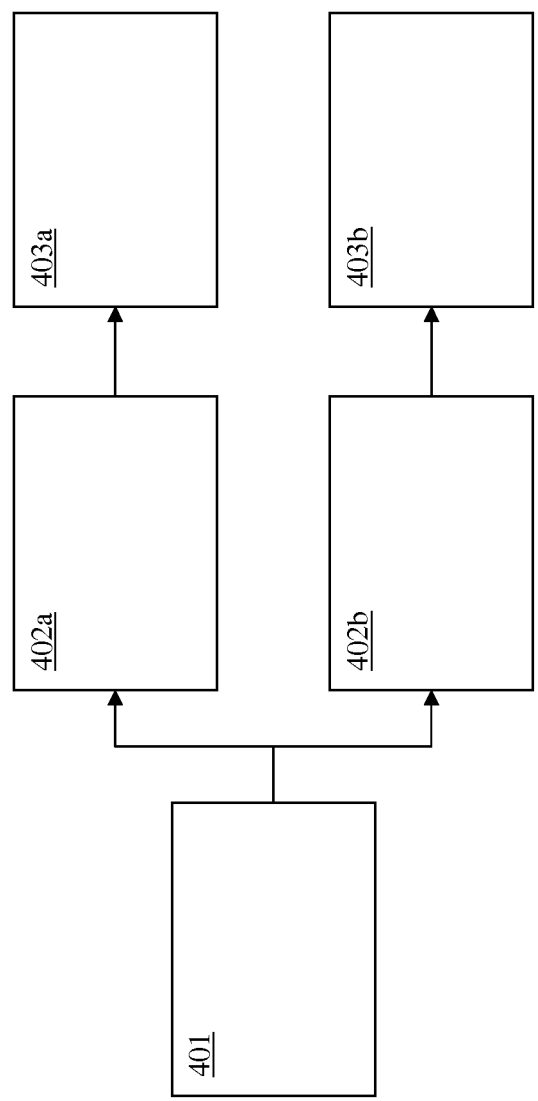
FIG. 3 is a flow chart for a method of measuring angular position and torque applied to a shaft, according to embodiments of the present invention.

FIG. 3 is a flowchart of a sensing method, according to embodiments of the present invention. In operation 401, a shaft affixed with a magnetostrictive ring may rotate. The magnetostrictive ring may include magnetically differentiated areas arranged around the circumference of the ring and generate a position-dependent magnetic field. During rotation, torque may induce magnetic field changes. In operation 402a, a magnetic field that varies with angular position may be measured, e.g., by a Hall effect sensor or other magnetometer. The magnetic field measurements may be output to a processor in operation 403a, and the shaft's angular position may be determined based on, for example, the number of magnetically differentiated areas that pass through the vicinity of a sensor, or the magnitude of the magnetic field. In another embodiment, the unique magnetic field of each magnetically differentiated area may indicate a unique angular position. Other factors may be considered. In operation 402b magnetic field changes induced by torque may be measured, e.g., by a Hall effect sensor or other magnetometer. Operation 402b may involve measuring an axial magnetic field that varies with torque. In operation 403b, measurements from a changing magnetic field induced by torque are output to a processor, and torque applied to a shaft may be determined. As shown in the flowchart, operation 402a and operation 403a may be performed concurrently after the shaft is rotated.

Embodiments of the present invention may include apparatuses for performing the operations described herein. Such apparatuses may be specially constructed for the desired purposes, or may comprise computers or processors selectively activated or reconfigured by a computer program stored in the computers. Such computer programs may be stored in a computer-readable or processor-readable non-transitory storage medium, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions. It will be appreciated that a variety of programming languages may be used to implement the teachings of the invention as described herein. Embodiments of the invention may include an article such as a non-transitory computer or processor readable non-transitory storage medium, such as for example a memory, a disk drive, or a USB flash memory encoding, including or storing instructions, e.g., computer-executable instructions, which when executed by a processor or controller, cause the processor or controller to carry out methods disclosed herein. The instructions may cause the processor or controller to execute processes that carry out methods disclosed herein.

Different embodiments are disclosed herein. Features of certain embodiments may be combined with features of other embodiments; thus certain embodiments may be combinations of features of multiple embodiments. The foregoing description of the embodiments of the invention has been presented for the purposes of illustration and description. It is not intended to be exhaustive or to limit the invention to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes as fall within the true spirit of the invention.

What is claimed is:

1. A combination torque and angular position sensing system comprising,
   a shaft,
   a circumferentially-magnetized, magnetostrictive ring of ferromagnetic material, the ferromagnetic material further magnetized so as to form a plurality of distinct, localized magnetic regions wherein each of the distinct, localized magnetic regions is characterized by a magnetic-field-orientation differing from that of the circumferentially-magnetized, magnetostrictive ring, the magnetostrictive ring connected to the shaft;

a first sensor configured to measure variation of magnetic field emanating from the plurality of distinct magnetic regions, the variation of magnetic field in accordance with shaft rotation; and a second sensor configured to measure variation of magnetic field emanating from the circumferentially-magnetized, magnetostrictive ring in accordance with torque applied to the shaft.

2. The sensing system of claim 1, further comprising a processor configured to determine angular position of the shaft from sensor feedback received from the first sensor.

3. The sensing system of claim 1, further comprising a processor configured to determine the torque applied to the shaft from sensor feedback received from the second sensor.

4. The sensing system of claim 1, wherein the each of the plurality of distinct, localized magnetic regions is further characterized by a magnetic field strength differing from that of the circumferentially-magnetized, magnetostrictive ring.

5. The sensing system of claim 1, wherein the plurality of distinct, localized magnetic regions includes at least one magnetic array including at least two magnetized regions having an opposite magnetic polarity from each other.

6. The sensing system of claim 1, wherein each of the plurality of distinct, localized magnetic regions is characterized by a magnetic-field strength different from each other.

7. The sensing system of claim 1, wherein each of the plurality of distinct, localized magnetic regions are circumferentially spaced around the ring.

8. A method of simultaneous sensing torque and angular position of a shaft, the method comprising:

providing a circumferentially-magnetized, magnetostrictive of ferromagnetic material, the ferromagnetic material further magnetized so as to form a plurality of distinct, localized magnetic regions wherein each of the distinct, localized magnetic regions is characterized by a magnetic-field-orientation differing from that of the circumferentially-magnetized, magnetostrictive ring, the magnetostrictive ring connected to the shaft;

measuring variation of magnetic field emanating from the plurality of distinct magnetic regions, the variation of magnetic field in accordance with shaft rotation measuring variation of magnetic field emanating from the circumferentially-magnetized, magnetostrictive ring in accordance with torque applied to the shaft.

9. The method of claim 8, further comprising using a processor to determine angular position of the shaft from the variation of magnetic field emanating from the at least one magnetic region.

10. The method of claim 8, further comprising using a processor to determine the torque applied to the shaft from the variation of magnetic field emanating from the circumferentially-magnetized, magnetostrictive ring.

11. The method of claim 8, wherein each of the plurality of distinct, localized magnetic regions is further characterized by a magnetic field strength differing from that of the circumferentially-magnetized, magnetostrictive ring.

12. The method of claim 8, wherein the plurality of distinct, localized magnetic regions includes at least one magnetic array including at least two magnetized regions having an opposite magnetic polarity from each other.

13. The method of claim 8, wherein the plurality of distinct, localized magnetic regions circumferentially spaced around the ring.

14. The method of claim 8, further comprising using a processor to determine angular position of the shaft from the variation of magnetic field emanating from the plurality of distinct, magnetic regions and the torque applied to the shaft from the variation of magnetic field emanating from the circumferentially-magnetized, magnetostrictive ring.

15. The method of claim 8, wherein at least two of the plurality of magnetic regions magnetized into the ring have magnetic field strengths differing from each other.

* * * * *